United States Patent

Joly et al.

[11] Patent Number: 6,159,323
[45] Date of Patent: Dec. 12, 2000

[54] PROCESS FOR SELECTIVE TRANSFER OF A MICROSTRUCTURE FORMED ON AN INITIAL SUBSTRATE TO A FINAL SUBSTRATE

[75] Inventors: Jean-Pierre Joly, St Egreve; Gérard Nicolas, Voreppe; Michel Bruel, Veurey, all of France

[73] Assignee: Commissariat a l'Energie Atomique, Paris, France

[21] Appl. No.: 09/200,388

[22] Filed: Nov. 24, 1998

[30] Foreign Application Priority Data

Dec. 2, 1997 [FR] France ................................. 97 15152

[51] Int. Cl.[7] .................................................. B32B 31/00
[52] U.S. Cl. .......................... 156/241; 156/230; 156/249
[58] Field of Search ................................. 156/230, 241, 156/247, 249, 272.2, 273.3, 275.7, 289, 295; 29/831, 832; 438/26, 107, 118; 216/13, 20

[56] References Cited

U.S. PATENT DOCUMENTS

| | | | |
|---|---|---|---|
| 3,992,236 | 11/1976 | Wanesky | 156/83 |
| 4,329,779 | 5/1982 | England | 29/840 |
| 5,258,325 | 11/1993 | Spitzer et al. | |
| 5,508,065 | 4/1996 | Weiner | |
| 5,897,727 | 4/1999 | Staral et al. | 156/99 |
| 5,915,167 | 6/1999 | Leedy | 438/108 |

OTHER PUBLICATIONS

Alignable Epitaxial Liftoff of GaAs Materials with Selective Deposition Using Polyimide Diaphragms, C. Camperi–Ginested, M. Hargis, N. Jokerst, and M. Allen, IEEE Transactions Photonics Technology Letters, vol. 3, No. 12, Dec., 1991.

*Primary Examiner*—Michael W. Ball
*Assistant Examiner*—John T. Haran
*Attorney, Agent, or Firm*—Pearne & Gordon LLP

[57] ABSTRACT

Process for transfer of a microstructure (12) from an initial substrate (10) to a final substrate (32). The process includes the following steps in sequence:

- bonding between the initial substrate (10) and an intermediate substrate (24), the microstructure facing the intermediate substrate,
- formation of at least one layer (30) of bond material on at least one selected region (16) of the initial substrate including the microstructure
- bring the said selected region (16) into contact with the final substrate,
- treatment of the bond material in an area corresponding to the selected region (16), to increase the bond force,
- breaking the selected region (16) of the initial substrate, from the intermediate substrate (24).

19 Claims, 2 Drawing Sheets

PROCESS FOR SELECTIVE TRANSFER OF A MICROSTRUCTURE FORMED ON AN INITIAL SUBSTRATE TO A FINAL SUBSTRATE

TECHNICAL DOMAIN

This invention relates to a process for selective transfer of a microstructure formed on one substrate called the initial substrate, to another substrate called the final substrate.

For the purposes of this invention, a microstructure means any electronic, mechanical or optical component or set of components formed on the initial substrate, by machining, material deposition or material forming techniques specific to microelectronics or micromechanics.

In particular, the invention can be used for the transfer of electronic components, that may be passive components or active components such as chips.

The transfer of components according to the invention is particularly advantageous in applications in which different components of a device must be made on substrates made of different materials, and in applications for which it is required to manufacture a number of components of a device separately before it is assembled.

For example, the invention may be used to transfer laser cavities made separately, onto a silicon substrate.

In another application field, the invention may also be used to transfer components of control circuits for a liquid crystal display screen, onto a glass plate designed for the manufacture of a display unit.

STATE OF THE PRIOR ART

Known techniques for transferring a component from an initial substrate to a final substrate usually use an "intermediate" substrate, the essential function of which is to provide mechanical support for the component during the transfer.

The main problems encountered when making component transfers are related to separation of the component from the initial substrate, and also separation of the component from the intermediate substrate.

Generally, components are separated from initial or intermediate supports using a technique called "lift-off". This technique is implemented by using substrates comprising a massive base part, a thin intermediate sacrificial layer made of a material that can be selectively etched chemically, and an upper layer on which the components are formed or onto which components are transferred.

When transferring components, the surface layer containing the components is separated from the massive base part without any components by chemically attacking the intermediate sacrificial layer to eliminate it. Elimination of this layer releases the components on the surface layer by a lift-off effect.

There are several difficulties and limitations with this technique.

The first difficulty is related to bringing the intermediate layer into contact with a chemical etching agent, usually a liquid. The action of the chemical agent is not very efficient, since the intermediate layer is thin and is located between the base part and the surface layer. This difficulty increases with the size of the component to be transferred, in other word with the extent of the intermediate sacrificial layer.

Furthermore, the need for selecting etching of the intermediate layer without deteriorating the component to be transferred makes it necessary to use particular materials which are not always compatible with the requirements of series production.

The state of the art is illustrated in documents (1) and (2), the references of which are given at the end of this description.

DESCRIPTION OF THE INVENTION

The purpose of this invention is to propose a process for transferring a microstructure from an initial substrate to a final substrate without any of the difficulties and limitations mentioned above.

One particular purpose is to propose such a process that does not involve etching of an intermediate sacrificial layer or lift-off operation.

Another purpose of the invention is to propose a process enabling selective transfer of one or several regions of a substrate comprising given microstructures, to particular areas on a final substrate.

Another purpose is also to propose a fast and inexpensive transfer process that can be used industrially for series production.

In order to achieve these purposes, the subject of the invention is more precisely a process for transferring at least one microstructure formed on a substrate called the initial substrate, to another substrate called the final substrate.

The process comprises the following steps in sequence:

a) preparation of the initial substrate to enable reversible bonding, with an initial bond force, between the initial substrate and a substrate called the intermediate substrate, b) bonding of the initial substrate with the intermediate substrate, the microstructure facing the intermediate substrate, c) formation of a layer of bond material on at least one selected region of the initial substrate including the microstructure, and/or on the reception region of the final substrate, the bond material having a bond capacity that may be increased by appropriate treatment, d) bring the said selected region of the initial substrate into contact with the reception region on the final substrate, e) treatment of the layer of bond material in an area corresponding to the region of the initial substrate comprising the microstructure, to increase the bond force in this area to a value exceeding the initial bond force, to fix the said region of the initial substrate onto the reception region on the final substrate, f) breaking the bond between the initial substrate region including the microstructure and the intermediate substrate, wherein portions of the initial substrate remain bonded to the intermediate substrate.

As mentioned above, the microstructure formed in the substrate may be composed of one or several electronic, optical or mechanical components.

This structure may be formed on the substrate surface by deposition or by forming the material on the substrate surface. It may also be formed within the thickness of the substrate in the form of doped regions and buried components. The structure may also consist of a combination of components formed in depth in the substrate and components such as contact points formed on its surface.

The process according to the invention does not involve any lift-off operation requiring chemical etching of a buried sacrificial layer.

Furthermore, according to the invention, and particularly due to step e) in which one or several regions of the substrate are treated selectively, selective transfers can be made that only concern these regions.

The combined action of preparation of the initial substrate to make its bond with the intermediate substrate reversible, and local strengthening of the bonds between the structure to be transferred and the final substrate, make it possible to selectively separate this structure.

In particular, separation may be done by tearing off the initial substrate region including the microstructure, from the intermediate substrate.

According to one particular feature of the invention, preparation of the surface of the initial structure to enable reversible bonding may include the formation of controlled roughness on the said surface of the substrate.

This roughness reduces the contact surface between the initial substrate and the intermediate substrate.

Thus, bonding done for example by gluing, with or without addition of material, creates relatively low bond forces that can be overcome when tearing off the microstructure.

In particular, the roughness is chosen such that the initial bond force between the initial substrate and the intermediate substrate is less than the bond force between the selected region of the initial substrate and the final substrate after the treatment in the step e).

According to one variant, preparation of the surface of the initial substrate to enable reversible bonding may also include formation of at least one initiating rupture in the initial substrate.

In particular, the initiating rupture may be formed by ionic implantation, for example of hydrogen, in part of the initial substrate that is to be bonded with the intermediate substrate. Hydrogen ions implanted in the initial substrate create an area of weakness along which the selected region can be separated from the initial substrate, including the microstructure.

In this case, the initial bond force means the bond force that has to be overcome to cause separation by tearing off along the area of weakness.

According to another variant, preparation of the initial substrate surface to enable reversible bonding may include formation of a layer called the rupture layer at the surface of the substrate, the rupture layer having a first thickness in an area facing at least one region of the initial substrate, comprising a microstructure, and with a second thickness exceeding the first thickness in an area facing a region of the initial substrate without any microstructure.

The formation of the rupture layer may include deposition of a layer of material that can be etched selectively with respect to the substrate, on the surface of the substrate. This layer is then selectively and partially etched to make it thinner in at least one area corresponding to at least one region of the substrate that includes a microstructure. There are no particular difficulties with this etching, since the layer of material to be etched is freely accessible on the surface of the initial substrate.

This particular embodiment of the invention is described in more detail in the rest of this description.

According to another particular aspect of the invention, the initial substrate may be thinned before step c).

Thinning may be done by chemical or mechanical etching.

It may also be thinned by cleavage, on a previously implanted cleavage layer in the initial substrate.

According to another advantageous aspect of the invention, it would also be possible before step d) to form at least one trench to weaken the initial substrate surrounding the said region of the substrate including the microstructure. Preferably, the weakening trenches and the area of the rupture layer with the first thickness are laid out to coincide, at least partly.

Due to these trenches, the initial substrate region including the microstructure can be more easily separated from the intermediate substrate. This region of the substrate can also be separated more easily from the remaining part of the initial substrate that is not concerned by the transfer and which remains bonded to the intermediate substrate.

Treatment of the layer of bond material in step e) of the process may include application of radiation in the region of the substrate including the microstructure.

Depending on the selected bond material, the radiation may be adapted to cause cross linking or melting of the bond material and thus lead to a stronger bond, possibly after a cooling period. This aspect is described in more detail in the remainder of the text.

According to one particular aspect of the invention, a transparent intermediate substrate may be used and radiation may be applied to the region of the substrate containing the microstructure, and the layer of bond material, through the transparent substrate.

A transparent final substrate may also be used, and radiation may be applied to the region of the substrate containing the microstructure, and the layer of bond material, through the final substrate.

The process according to the invention is particularly suitable for the transfer of structures with a thickness of less than 10 $\mu$m, but for which the area in the plane of the initial substrate surface may vary from a few $\mu m^2$ to a few $cm^2$.

Depending on the area of the structure, the radiation applied for treatment of the bond material may be applied at isolated points or by scanning.

Advantageously, and particularly when either the intermediate or the final substrate is transparent, visual marks may be formed on the final substrate and the intermediate substrate to enable precise alignment of the substrates during step d) of the process.

In particular, this type of measure makes automatic assembly of substrates possible using an appropriate machine.

Other characteristics and advantages of the invention will become clear from the following description with reference to the figures in the attached drawings. This description is given for illustrative purposes only and is not restrictive in any way.

DETAILED DESCRIPTION OF EMBODIMENTS OF THE INVENTION

The following description concerns a particular transfer of a single microstructure. However, it will be understood that the transfer process may be performed simultaneously for several microstructures of this type.

Figure 1:
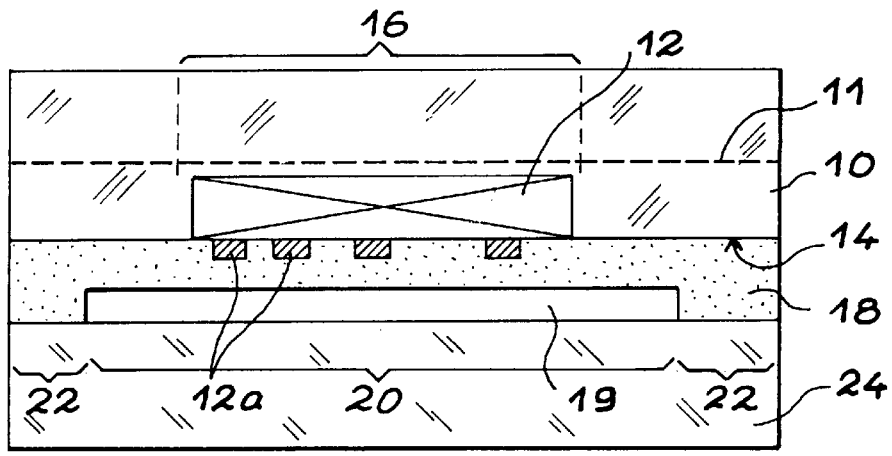
FIG. 1 is a diagrammatic section through an initial substrate equipped with a microstructure and bonded with an intermediate substrate.

FIG. 1 shows an initial substrate 10, for example made of silicon, on which a microstructure is formed. In the example described, the microstructure comprises an electronic circuit 12 formed in depth in substrate 10, and contact areas 12a formed on the surface 14 of the said substrate. The substrate region containing the microstructure is indicated by reference 16. This region is called the transfer region in the rest of this text.

A layer 18, called the rupture layer, is formed on surface 14 of the substrate. For example, this could be a layer of silica or polymer. The thickness of this layer is chosen to be sufficient so that a recess 19 can be formed facing the substrate transfer region 16. The recess is formed by local etching of the rupture layer 18 and can be used to define two areas within this layer. There is firstly a thinned area 20 with a first thickness located mainly facing the transfer region 16, and an area 22 with a second, greater thickness outside the transfer region. Note that the thinned area 20 may preferably be extended slightly beyond the extent of the transfer region.

The initial substrate 10 is bonded with an intermediate substrate 24 by means of the rupture layer 18, for which the thicker area 22 is sealed on the intermediate substrate 24.

Due to the recess 19, the initial bond force between the first substrate and the intermediate substrate is weak.

Consequently, a recess 19 can be made with sufficient depth so that, considering the stress profile of the materials used, the rupture layer 18 does not bend towards the intermediate substrate and does not come into contact with it in the region of the recess 19.

Figure 2:
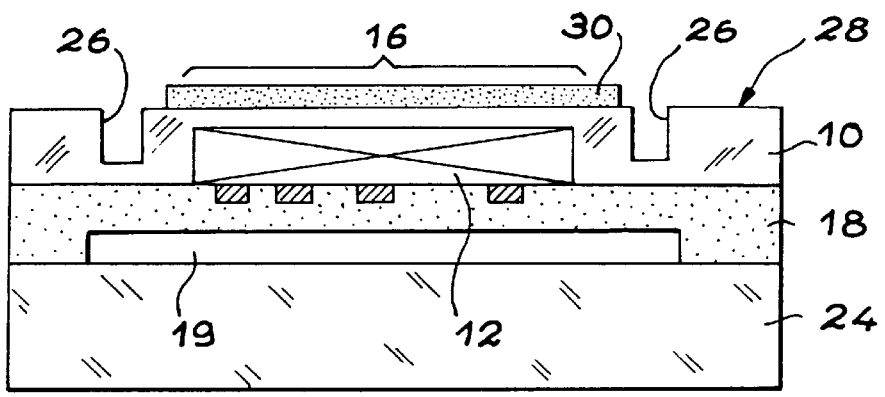
FIG. 2 is a diagrammatic section through the substrate in FIG. 1, prepared for bonding with a final substrate.

FIG. 2 illustrates a subsequent step of the process in which the initial substrate 10 is thinned. Thinning is stopped in order to leave a sufficient thickness of the substrate to contain and guarantee mechanical support for component 12.

Thinning may be done by grinding, rubbing down, by chemical etching, with or without a stop layer, or by cleavage.

If thinning is done by cleavage, a layer of gaseous ions called the cleavage layer, diagrammatically shown as reference 11 in FIG. 1, is implanted beforehand in the initial substrate. Thus, heat treatment can cause cleavage of the substrate along this layer, as a result of a crystalline rearrangement effect.

In addition to thinning, trenches 26 are formed (by etching) in the initial substrate 10 starting from its free surface 28 obtained after thinning.

The trenches 26 that extend over all or part of the thickness of the remaining initial substrate, delimit region 16 of this substrate to be transferred, and containing the electronic component 12. They coincide at least partly with the recess 19 formed in the rupture layer 18.

In particular, the trenches form an area of least resistance in the initial substrate.

As shown in FIG. 2, a layer 30 of bond material is formed locally on the free surface 28 of the initial substrate, mainly in the transfer region 16.

The bond material is a material with a bond capacity that can be increased by appropriate treatment.

For example, it could be a polymer that sets when exposed to U.V. radiation.

In the example described, the bond material is a material that can be melted such as Sn, Pb, Sn—Pb, In—Pb, etc.

When this type of material is heated by appropriate radiation, it melts and can give a very strong bond after cooling.

According to one advantageous embodiment of the invention, the bond material may be chosen to be electrically conducting to make electrical connections between component 12 in transfer region 16 and the components on the final substrate. In this case, the bond material may be formed by a meltable conducting alloy as mentioned above, or by conducting glue.

The bond material may be formed over the entire surface of the transfer region or on selected parts only, in order to form one or several independent electrical connections with the final substrate.

Note that the layer of bond material may also be formed on all or part of a reception region of the final substrate.

Figure 3:
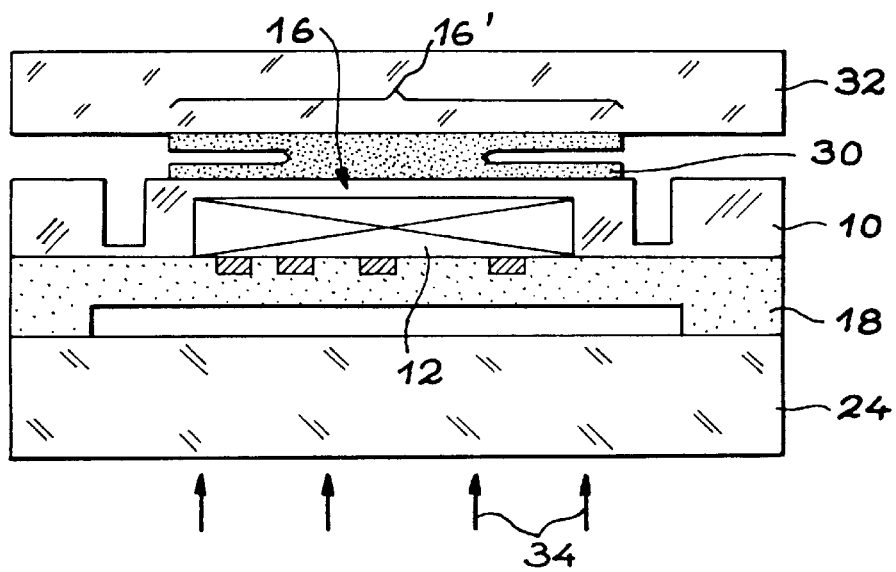
FIG. 3 is a diagrammatic section through the substrate in FIG. 2 during bonding between a selected region of this substrate and the final substrate.

FIG. 3 shows a subsequent step in which a reception region 16' of a final substrate 32 is put into contact with the transfer region 16 of the initial substrate (containing component 12).

This figure shows that the transfer region 16 and the reception region 16' are both provided with a layer of bond material 30.

Radiation 34, such as infrared radiation, is applied to the transfer region through the intermediate substrate 24 that is chosen to be transparent to this radiation. Radiation 34 can make the meltable bonding material in layer 30 melt, in order to weld the transfer region 16 to the final substrate 32. The maximum bond force is obtained after the transfer region and the meltable material have cooled.

Intermediate substrates transparent to ultraviolet radiation should be used in one variant in which the bond material is a photosetting polymer that sets when exposed to this type of radiation.

Note that radiation may also be applied to the bond material through the final substrate 32 that may or may not be chosen to be transparent depending on the type of bond material used.

After the transfer region 16 containing the component 12 has been firmly fixed to the final substrate 32, this region can be separated from the intermediate substrate.

Figure 4:
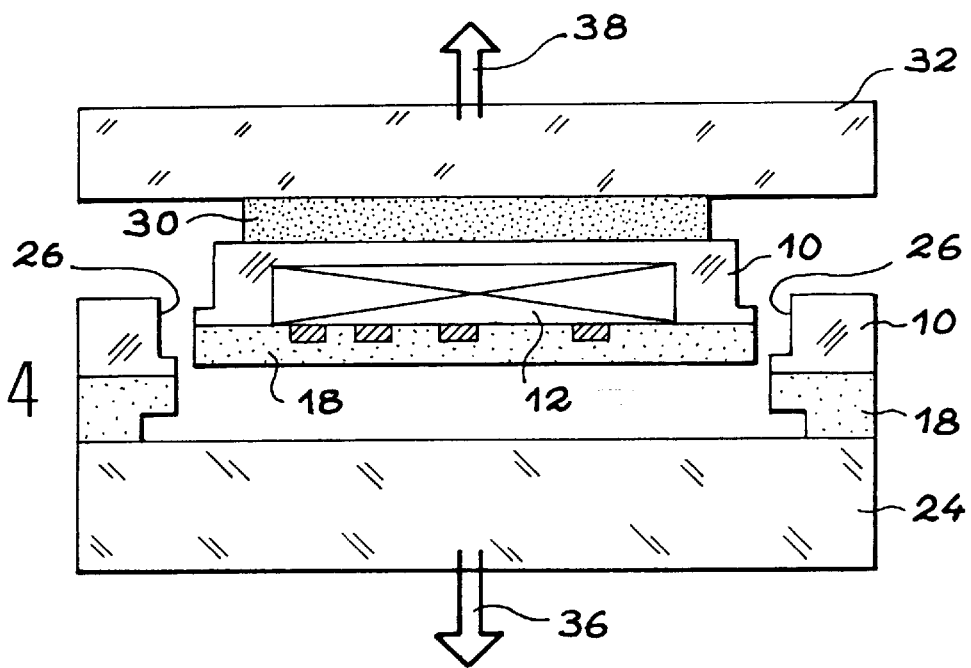
FIG. 4 is a diagrammatic section illustrating separation of the selected region from the intermediate substrate.

This separation is shown in FIG. 4. Tension forces 36, 38, and possibly shear forces, are applied to the final substrate 32 and to the intermediate substrate.

Since the bond force of the bond material layer 30 was increased in the transfer region 16, this region remains fixed to the final substrate.

However, the initial substrate is torn off at the bottom of the trenches 26.

Thus region 16 of the initial substrate including component 12 is released, not only from the intermediate substrate, but also from the remaining part of the initial substrate 10 which does not include the component.

Figure 5:
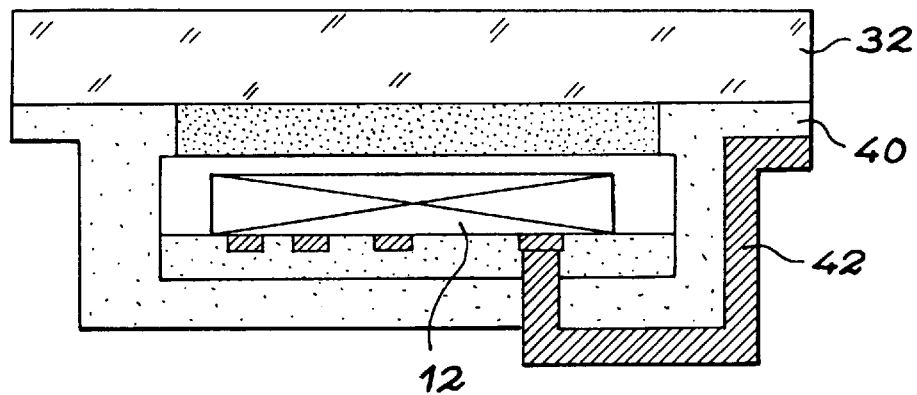
FIG. 5 is a diagrammatic section illustrating the selected region bonded to the final substrate, and the formation of a contact area with the microstructure located within the said selected region.

FIG. 5 illustrates the treatment steps that follow transfer of the microstructure.

An insulating layer 40 is deposited on the microstructure and on the final substrate. Then metallic connection tracks such as line 42 shown in FIG. 5 are formed to electrically connect the contact areas 12a of the component 12 to other components of the target substrate (not shown).

Thus component 12 may be electrically connected to components of the final substrate 32 through conducting tracks and/or through bond material 30 as described above.

DOCUMENTS MENTIONED (1) U.S. Pat. No. 5,258,325

(2) "Alignable Epitaxial Liftoff of GaAs Materials with Selective Deposition Using Polyimide Diaphragms" C. Camperi-Ginestet et al. IEEE transactions Photonics Technology Letters, vol. 3, No. 12. December 1991, pages 1123–1126.

What is claimed is:

1. Process for the selective transfer of at least one microstructure (12) formed on a substrate (10) called the initial substrate, to another substrate (32) called the final substrate, the process comprises the following steps in sequence:

a) preparing the initial substrate to enable reversible bonding, with an initial bond force, between the initial substrate (10) and a substrate (24) called the intermediate substrate, (b) bonding of the initial substrate (10) with the intermediate substrate (24), the microstructure facing the intermediate substrate, (c) forming a layer (30) of bond material on at least one selected region (16) of the initial substrate including the microstructure, and/or on a reception region (16') of the final substrate, the bond material having a bond capacity that may be locally increased by appropriate treatment, (d) contacting the said selected region (16) of the initial substrate with the reception region on the final substrate, (e) treating the layer of bond material in an area corresponding to the selected region (16) of the initial substrate, comprising the microstructure, to locally increase the bond force in this area to a value exceeding the initial bond force, to fix the said selected region (16) of the initial substrate onto the reception region (16') on the final substrate (32), (f) breaking the bond between the selected region (16) of the initial substrate, including the microstructure, and the intermediate substrate (24), wherein portions of the initial substrate remain bonded to the intermediate substrate.

2. Transfer process according to claim 1, in which the initial substrate (10) is thinned before step c).

3. Transfer process according to claim 2, in which the initial substrate (10) is thinned by chemical and/or mechanical etching.

4. Transfer process according to claim 2, in which the initial substrate (10) is thinned by cleavage along a cleavage layer (11) previously implanted in the initial substrate (10).

5. Transfer process according to claim 1, in which the preparation of the initial substrate to enable reversible bonding includes the formation of controlled roughness on the surface of substrate (10).

6. Transfer process according to claim 1, in which preparation of the initial substrate to enable reversible bonding includes the formation of at least one initiating rupture in the initial substrate.

7. Transfer process according to claim 6, in which at least one trench (26) weakening the initial substrate (10) surrounding the said region (16) of the substrate containing the microstructure (12), is also formed before step d).

8. Transfer process according to claim 1, in which preparation of the initial substrate to enable reversible bonding includes the formation of one layer (18) called the rupture layer on the surface (14) of substrate (10), the rupture layer having a first thickness in an area facing the selected region (16) of the initial substrate, comprising a microstructure (12), and with a second thickness exceeding the first thickness in an area located around the selected region (16), wherein the first thickness area forms a recess (19) such that the first thickness area does not contact the intermediate substrate (24), said recess (19) resulting in a weak bond between the initial substrate (10) and the intermediate substrate (24).

9. Transfer process according to claim 8, in which the formation of the rupture layer (18) includes deposition on the surface (14) of the substrate (10), of a layer of a material that can be selectively etched with respect to the substrate, and partial selective etching of this layer to make it thinner in at least one area corresponding to the selected region (16) of the substrate, thus forming the recess (19).

10. Transfer process according to claim 8, in which at least one trench (26) formed to weaken the initial substrate (10), and the area of the rupture layer (18) with the first thickness, are laid out to coincide at least partially.

11. Transfer process according to claim 1, in which at least one trench (26) weakening the initial substrate (10) surrounding the said region (16) of the substrate containing the microstructure (12), is also formed before step d).

12. Transfer process according to claim 11, wherein an area of a rupture layer (18) is formed having a first thickness in an area facing the selected region (16) of the initial substrate, and the first thickness and the weakening trenches (26) are laid out to coincide at least partially.

13. Process according to claim 1, in which the bond material in the bond layer (30) is chosen from meltable materials and materials with a bond force that can be increased by exposure to appropriate radiation.

14. Process according to claim 1, in which marks visible through the intermediate substrate are formed on the final substrate, and marks visible trough the final substrate are formed on the intermediate substrate, the marks being used for alignment of the intermediate and final substrates before putting into contact in step d).

15. Transfer process according to claim 1, characterized in that it is completed by operations to electrically connect microstructure (12) with components previously formed on the final substrate (32).

16. Process according to claim 1, in which treatment of the layer of bond material in step e) includes exposure to radiation in the selected region (16) of the substrate including the microstructure.

17. Transfer process according to claim 16, in which a transparent intermediate structure (24) is used, and radiation is applied to the selected region (16) of the initial substrate including the microstructure (12) through the transparent substrate.

18. Transfer process according to claim 17, in which a transparent final substrate (32) is used, and the selected region (16) of the initial substrate including the microstructure (12) is exposed to radiation through the final substrate (32).

19. Transfer process according to claim 1, in which an electrically conducting bond material (30) is used to form at least one electrical connection between the said selected region (16) and the final substrate (32).

* * * * *